US010659035B2

United States Patent
Erlbacher et al.

(10) Patent No.: US 10,659,035 B2
(45) Date of Patent: May 19, 2020

(54) POWER MODULE WITH A UNIPOLAR SEMICONDUCTOR COMPONENT FOR A LONG SERVICE LIFE

(71) Applicant: FRAUNHOFER-GESELLSCHAFT ZUR FOERDERUNG DER ANGEWANDTEN FORSCHUNG E.V., Munich (DE)

(72) Inventors: Tobias Erlbacher, Erlangen (DE); Andreas Schletz, Erlangen (DE)

(73) Assignee: FRAUNHOFER-GESELLSCHAFT ZUR FOERDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/589,361

(22) Filed: Oct. 1, 2019

(65) Prior Publication Data

US 2020/0112304 A1    Apr. 9, 2020

(30) Foreign Application Priority Data

Oct. 4, 2018   (DE) .................. 10 2018 216 998

(51) Int. Cl.
  *H03K 17/687*   (2006.01)
  *H03K 17/14*    (2006.01)
  *H01L 29/16*    (2006.01)

(52) U.S. Cl.
  CPC ....... *H03K 17/145* (2013.01); *H01L 29/1608* (2013.01)

(58) Field of Classification Search
  CPC .................. H03K 17/145; H01L 29/1608
  USPC ................................................. 327/434
  See application file for complete search history.

(56) References Cited

U.S. PATENT DOCUMENTS

| 9,252,292 | B2  |   | 2/2016 | Schulze ............... H01L 29/861 |
| 9,373,617 | B2  | * | 6/2016 | Das .................... H01L 27/0629 |
| 9,640,617 | B2  | * | 5/2017 | Das ........................ H01L 24/49 |
| 9,673,283 | B2  | * | 6/2017 | Henning ............. H01L 29/7395 |
| 2017/0263712 | A1 |   | 9/2017 | Siemieniec et al. |

OTHER PUBLICATIONS

Li et al.; *Built-In Reliability Design of a High-Frequency SiC MOSFET Power Module*; 7th International Power Electronics Conference; May 18-21, 2014; Hiroshima Japan.

(Continued)

*Primary Examiner* — Ryan Jager
(74) *Attorney, Agent, or Firm* — Renner Kenner Greive Bobak Taylor & Weber

(57) ABSTRACT

In a power module that has a carrier substrate with at least one unipolar semiconductor component as a power switch, the unipolar semiconductor component is configured such that a temperature rise of the semiconductor component, from a first temperature up to which the semiconductor component heats in operation at 50% full load, to a second temperature up to which the semiconductor component heats in operation at full load, is less than a temperature rise of the semiconductor component from an initial temperature at zero load to the first temperature. As a result of the reduced temperature rise between 50% and 100% full load the service life of the power module can be lengthened.

8 Claims, 3 Drawing Sheets

(56) References Cited

OTHER PUBLICATIONS

Buetow et al; *High Power, High Frequency SiC-MOSFET System With Outstanding Performance, Power Density and Reliability*; Proceedings of the 29$^{th}$ International Symposium on Power Semiconductor Devices & ICs; Sapporo; pp. 419-422; May 28, 2017.

* cited by examiner

POWER MODULE WITH A UNIPOLAR SEMICONDUCTOR COMPONENT FOR A LONG SERVICE LIFE

TECHNICAL FIELD OF APPLICATION

The present invention relates to a power module, which has a carrier substrate with at least one unipolar semiconductor component as a power switch. Power modules are used in many applications in which power converters are required for high electrical performance. Examples are voltage transformers for base load applications such as ventilation systems, computer centres, pump drives or high voltage direct current (HVDC) transmission applications. The intermediate circuit voltage of these applications is typically 400 V or higher. The power modules have a suitable carrier substrate on which one or more unipolar and/or bipolar semiconductor power switches, such as power diodes, MOSFETs, IGBTs, BJTs, thyristors, GTOs or JFETs are arranged, and which also serves to dissipate the heat loss generated during operation of these power switches.

The service life of the power modules, or more particularly, the power switches arranged on the power modules, depends very much on the temperature rise of the semiconductor components that occurs between part load operation and full load operation in the above-mentioned applications. The temperature rise ensues from the difference between the temperature up to which the semiconductor component heats at part load, and the temperature up to which the semiconductor component heats at full load. Here "full load" is to be understood to be the operation of the semiconductor component at the rated current specified for the semiconductor component.

PRIOR ART

Different concepts have so far been used to increase the service life. Thus, for example, it is known from J. Li et al., "Built-In Reliability Design of a High-Frequency SiC MOSFET Power Module", in: 7th International Power Electronics Conference, 18-21 May 2014, Hiroshima, Japan, that in the course of the design of the power module the material parameters are suitably customised with the aid of finite element modelling in order to achieve the longest possible service life. These material parameters mainly concern the carrier substrate and the metallisation for the contacts between the semiconductor components and the carrier substrate.

In another concept, the housing of the power module is suitably customised in order to increase the service life of the power module. Thus, for example, Sven Buetow et al., "High power, high frequency SiC-MOSFET system with outstanding performance, power density and reliability", Proceedings of The 29th International Symposium on Power Semiconductor components & ICs, Sapporo, pp. 419-422, shows an appropriately new housing technology for purposes of increasing the reliability of certain power modules.

The object of the present invention is to specify a power module with a carrier substrate and at least one unipolar semiconductor component as the power switch, which has an increased service life compared to power modules of known art with a unipolar semiconductor component, or in which the semiconductor component can be implemented with a smaller chip area for a comparable service life.

DESCRIPTION OF THE INVENTION

The object is achieved with the power module in accordance with patent claim 1. Advantageous designs of the power module are the subject matter of the dependent claims, or can be found in the following description together with the examples of embodiment.

The proposed power module has a carrier substrate with at least one unipolar semiconductor component as a power switch, which can be implemented as a power transistor or power diode, for example. In the proposed power module, the unipolar semiconductor component is designed such that a temperature rise of the semiconductor component, from a first temperature up to which the semiconductor component heats during operation at 50% of full load, to a second temperature up to which the semiconductor component heats during operation at full load (rated current), is less than a temperature rise of the semiconductor component from an initial temperature at zero load to the first temperature. The temperature difference between the initial temperature and the first temperature is preferably at least twice the temperature difference between the first temperature and the second temperature. The initial temperature corresponds to the temperature of the semiconductor component when the power module enters operation, or is switched on, or is in idle mode, and is usually in the range between 20 and 25° C., but can also correspond to the coolant temperature if the power module is actively cooled. In what follows, operation at 50% of full load is also referred to as part load.

In the proposed power module, a specially designed, that is to say, customised unipolar semiconductor component is used, which has a greater temperature rise between zero load and part load than between part load and full load. This is not the case with the power modules of known prior art, in which a linear increase in the resistance of the unipolar power semiconductor component occurs with temperature. This linear increase in resistance results in a greater temperature rise between part load and full load than between zero load and part load. By virtue of the special design of the unipolar semiconductor component in accordance with the present invention, a lower temperature rise is achieved in the range between part load and full load, which is of great significance for the service life, such that the service life of the semiconductor component and thus of the power module is increased compared to the power modules of known prior art. The reduction of the temperature rise between part load and full load is achieved by a suitable configuration of the temperature-dependent resistance of the unipolar semiconductor component during its manufacture. Thus this semiconductor component is designed so as to have a greatly increased resistance at low temperature, which then decreases from the low initial temperature as a result of self-heating with increasing temperature up to the first temperature, up to which the semiconductor component heats in part load operation. This resistance profile can be configured, for example, by the ionisation energy of the dopants in the drift region of the semiconductor component, in particular by using dopants with an appropriately high ionisation energy. Here typical ionisation energies can lie between 250 and 500 meV, as is the case, for example, for phosphorus in n-doped 4H-SiC, or for boron in p-doped diamond. This results in a higher component resistance at lower current intensities, that is to say, current densities below part load, than at higher current intensities, that is to say, current densities between part load and full load. The resistance of the semiconductor component at 25° C., for example, can be more than five times, preferably more than ten times, the value of the resistance at 150° C.

The temperature-dependent resistance of the unipolar semiconductor component preferably has a profile with a minimum in the vicinity of the first temperature, in particular within a range of ±25° around the first temperature, such that the resistance of the semiconductor component increases once again between part load and full load. This increase in resistance between part load and full load is, however, much smaller than the difference in resistance between the initial temperature and the first temperature.

By the appropriate configuration of the temperature-dependent resistance profile of the unipolar semiconductor component, the semiconductor component heats up very strongly below part load as a result of its high resistance, so that the temperature rise between part load and full load turns out to be significantly lower. This results in a longer service life of the semiconductor component, and the power module with this semiconductor component, compared to a semiconductor component with a linear resistance increasing with temperature, when the semiconductor component has the same chip area. Alternatively, the chip area of the semiconductor component can be reduced in order to achieve a higher current density with the same service life. This saves space and significantly reduces the costs of the power module. The proposed power module can be designed for a temperature increase between 50% and 100% rated power of less than 2.0 Kcm$^2$/A, preferably of less than 1.5 Kcm$^2$/A, particularly preferably of less than 1.0 Kcm$^2$/A.

Preferred areas of application for the power module are the voltage transformers mentioned in the introductory description, for applications with base load, in particular for voltages 400 V, such as ventilation systems, computer centres, pump drives or applications for high-voltage direct current transmission (HVDC).

BRIEF DESCRIPTION OF THE FIGURES

In what follows the proposed power module is explained in more detail using examples in conjunction with the figures. Here.

WAYS FOR CARRYING OUT THE INVENTION

In the proposed power module, the temperature rise between 50% and 100% full load is reduced compared to the temperature rise of power modules of known art with corresponding semiconductor components by configuring and adapting the temperature-dependent resistance profile of the unipolar semiconductor component. For this purpose, the semiconductor component in the preferred design is designed in such a way that it has a greatly increased resistance at low temperature compared to the resistance in the part load range. In contrast, power modules of known art, or more particularly, the unipolar power semiconductor components arranged on them, such as Si CoolMOS, SiC VDMOS, SiC Schottkydiode/JBS, diamond Schottkydiode/JBS, exhibit a linear increase in resistance with temperature.

Figure 1:
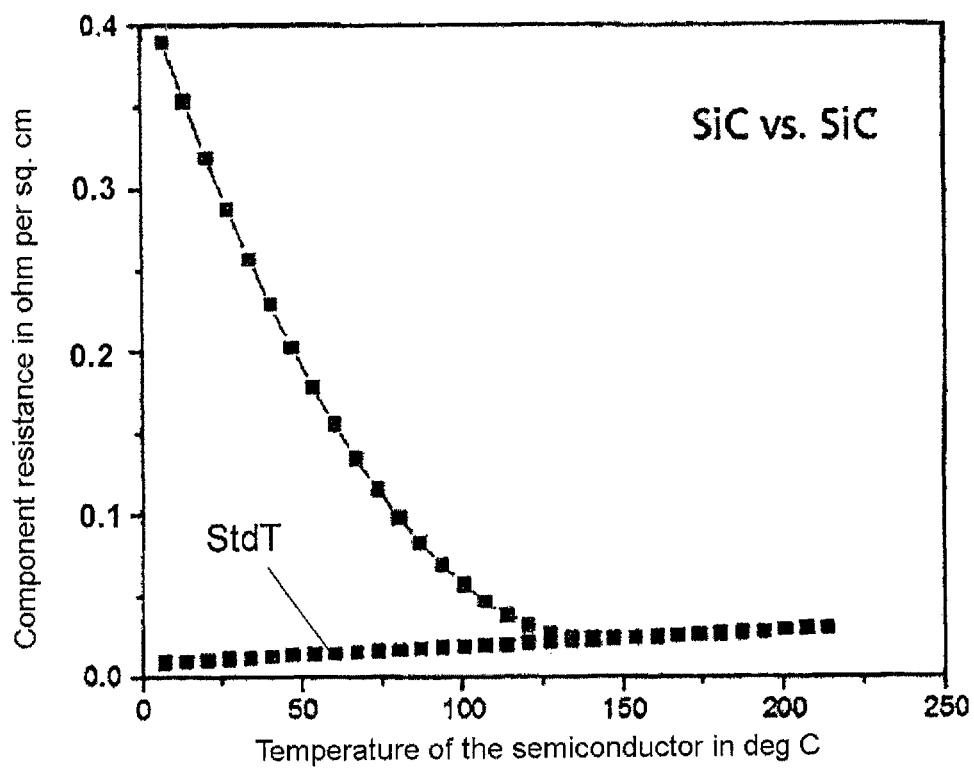
FIG. 1 shows two comparisons of the temperature-dependent resistance of the semiconductor component, between two designs of the proposed power module and one design of a prior art power module.
Figure 1:
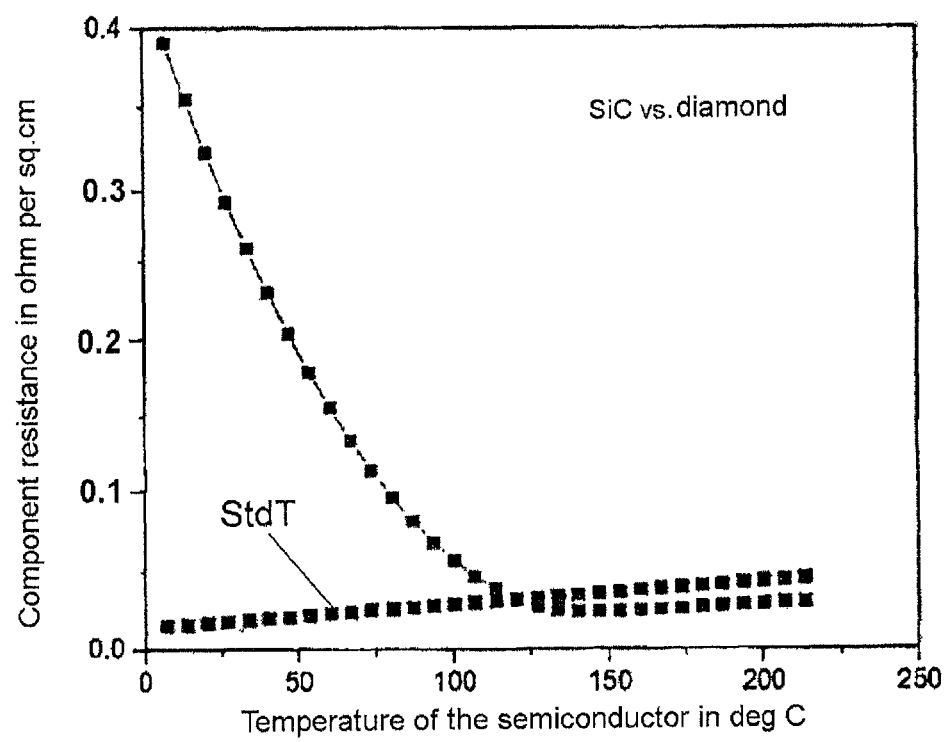

FIG. 1 shows in each of the two diagrams the dependence of the resistance of the unipolar semiconductor component on the temperature of the semiconductor in a prior art, power module, compared to a design of power module in accordance with the present invention. Here the prior art power module has a unipolar semiconductor component based on SiC, while the inventive power module in one design has a unipolar semiconductor component based on SiC (upper diagram) and in another design a unipolar semiconductor component based on diamond (second diagram). The same is true for the other two figures. Both diagrams show that in the prior art power module, the resistance increases linearly with temperature, such that after the power module enters operation, the semiconductor component heats up, for example, to a temperature of 50° C. (first temperature) at 50% full load, and up to a temperature of 150° C. (second temperature) at full load. In contrast, the resistance of the semiconductor component in the proposed power module has a very high resistance in the low temperature range, so that the semiconductor component heats up much faster at low currents, that is to say, low current densities, after the power module enters operation, and already has a temperature (first temperature) of, for example, 130° C. at 50% full load. The temperature rise between 50% and 100% of the full load at 150° C. is thus greatly reduced. In both diagrams, the doping profile of the semiconductor component in the proposed power module has been configured such that the semiconductor component has a minimum component resistance (due to self-heating) in the vicinity of, for example, 40% of the rated current or full load. The component resistance then increases again almost linearly with temperature, although this increase is much smaller than the fall between low temperature and the temperature at part load.

Figure 2:
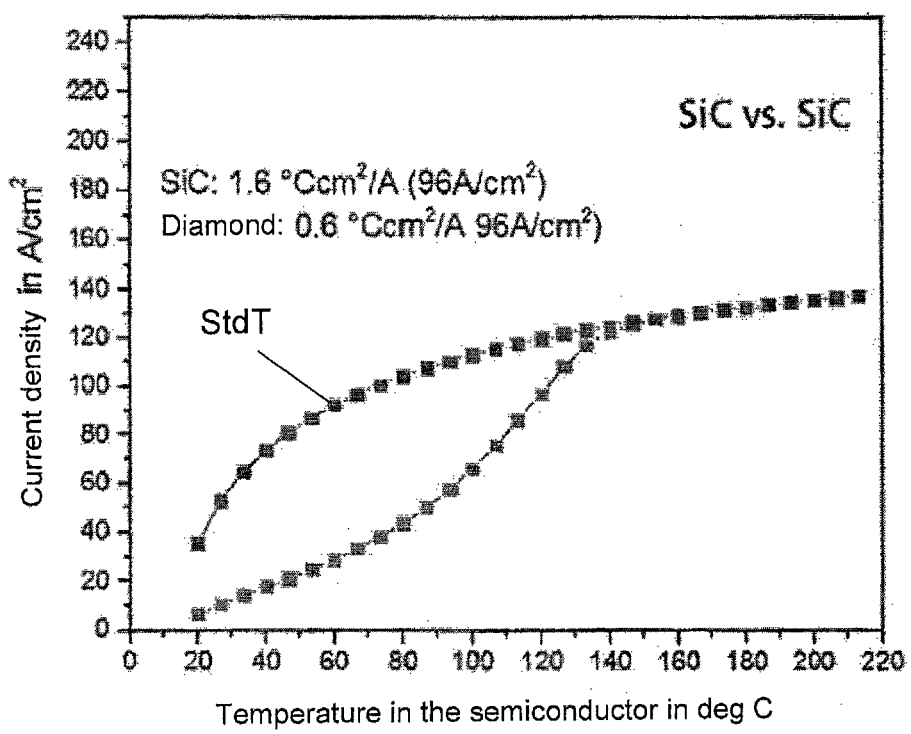
FIG. 2 shows two comparisons of the dependence of the current density on the temperature in the semiconductor, between two designs of the proposed power module and one design of a prior art power module.
Figure 2:
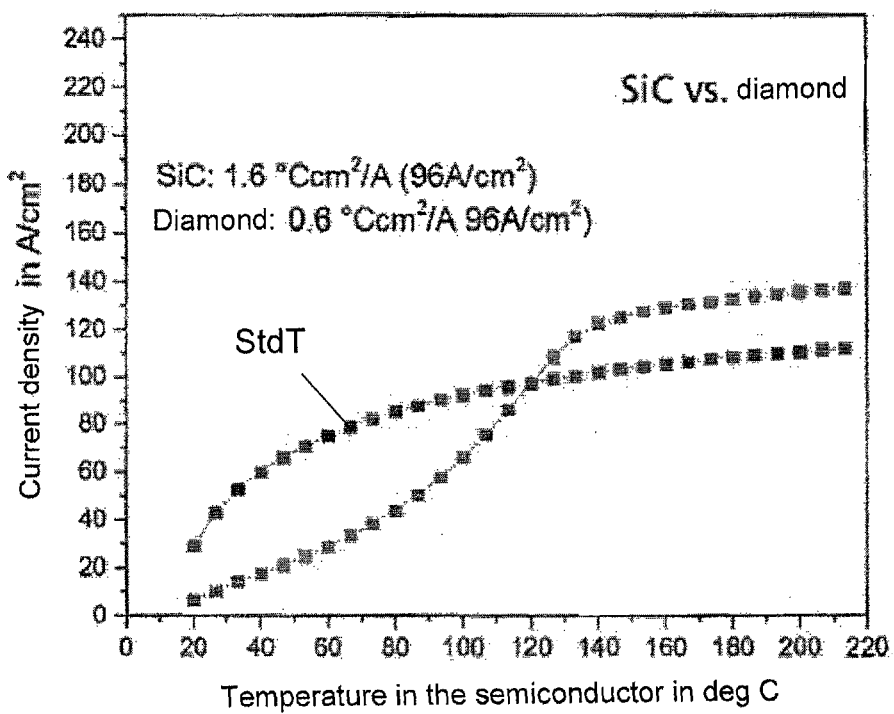

FIG. 2 shows the same situation again in terms of current density. The two diagrams show the dependence of the current density through the unipolar semiconductor component of the power module on the temperature in the semiconductor. From both diagrams it can be seen that the power module of the present invention has a strong increase in current density over a small temperature range. Ideally, the resistance curve of the unipolar semiconductor component of the proposed power module is designed for a parabolic reduction of the resistance up to the maximum operating temperature: $P=U*I=R_{on}*I^2$, where $R_{on}=f(1/I^2)$ for P=constant. By virtue of the profile of the resistance curve in the unipolar semiconductor component of the proposed power module, there is greater heating of the semiconductor component in the range between the initial temperature in idle mode or before the power module enters operation, up to 50% of full load, and less heating between 50% and 100% of full load.

Figure 3:
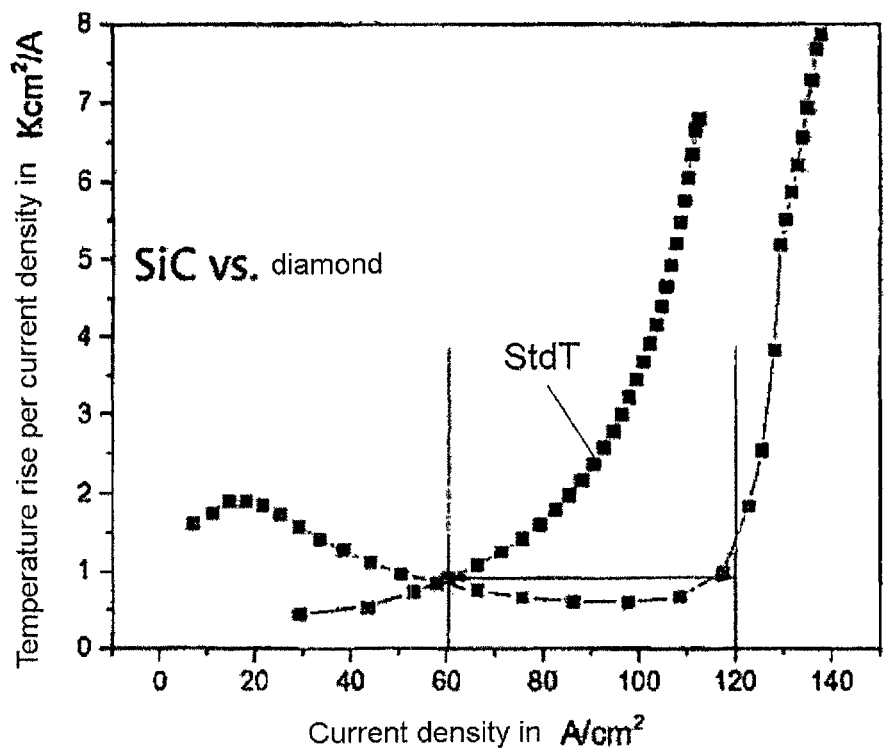
FIG. 3 shows two comparisons of the dependence of the temperature rise per current density on the current density in the semiconductor, between two designs of the proposed power module and one design of a prior art power module.
Figure 3:
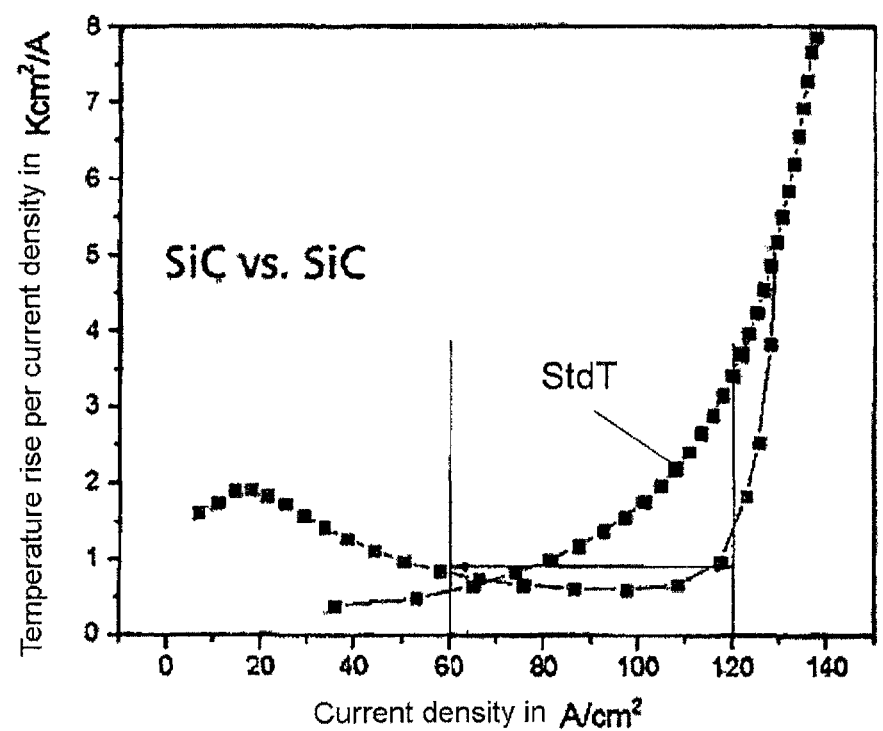

Finally, FIG. 3 shows an illustration of the temperature rise per current density as a function of the current density for the comparative examples already described. From these diagrams it can be seen that the proposed power module has a smaller temperature rise in the addressed current density range between 50% and 100% full load. This enables a longer service life of the power module to be achieved. Alternatively, a smaller chip area can be provided for the unipolar semiconductor component (higher current density), with a comparable service life as for prior art modules. By this means costs are saved for the power module. The chip for the semiconductor component of the proposed power module can be sintered either on the rear face or on both faces. Furthermore, this chip can also be bonded with Al or Cu wire on the front face.

The invention claimed is:

1. A power module, which has a carrier substrate on which at least one unipolar semiconductor component is arranged as a power switch,
characterised in that,
the unipolar semiconductor component is designed such that a temperature rise of the semiconductor component, from a first temperature up to which the semiconductor component heats during operation at 50% of full load, to a second temperature up to which the semiconductor component heats during operation at full load, is less than a temperature rise of the semiconductor component from an initial temperature at zero load to the first temperature.

2. The power module in accordance with claim 1,
characterised in that,
a temperature-dependent resistance of the unipolar semiconductor component decreases from an initial value at the initial temperature with increasing temperature to the first temperature.

3. The power module in accordance with claim 2,
characterised in that,
the temperature-dependent resistance of the unipolar semiconductor component has a profile with a minimum in the vicinity of the first temperature.

4. The power module in accordance with claim 3,
characterised in that,
the temperature-dependent resistance of the unipolar semiconductor component decreases further from the initial value at the initial temperature to the first temperature than it increases from the first to the second temperature.

5. The power module in accordance with claim 2,
characterised in that,
the initial value of the temperature-dependent resistance at the initial temperature is higher by at least a factor of 5 than the resistance value at the second temperature.

6. The power module in accordance with claim 1,
characterised in that,
the temperature rise of the unipolar semiconductor component from the first temperature to the second temperature in dependence on a current density through said unipolar semiconductor component is less than 2.0 K*cm$^2$/A.

7. The power module in accordance with claim 1,
characterised in that,
the temperature rise per current density of the unipolar semiconductor component from the first temperature to the second temperature is less than in the range below the first temperature.

8. The power module in accordance with claim 1,
characterised in that,
the unipolar semiconductor component is a SiC semiconductor component or a diamond semiconductor component.

* * * * *